(12) United States Patent
Lee

(10) Patent No.: US 11,678,500 B2
(45) Date of Patent: Jun. 13, 2023

(54) ORGANIC LIGHT EMITTING DIODE DISPLAY DEVICE HAVING CONDUCTIVE LAYER, CONDUCTIVE FILL MATERIAL AND CONDUCTIVE BLACK MATRIX

(71) Applicant: LG Display Co., Ltd., Seoul (KR)

(72) Inventor: MiReum Lee, Gimhae-si (KR)

(73) Assignee: LG DISPLAY CO., LTD., Seoul (KR)

( * ) Notice: Subject to any disclaimer, the term of this patent is extended or adjusted under 35 U.S.C. 154(b) by 169 days.

(21) Appl. No.: 16/995,321

(22) Filed: Aug. 17, 2020

(65) Prior Publication Data
US 2021/0083221 A1 Mar. 18, 2021

(30) Foreign Application Priority Data

Sep. 17, 2019 (KR) .......................... 10-2019-0114257

(51) Int. Cl.
| | |
|---|---|
| H10K 50/824 | (2023.01) |
| H10K 50/858 | (2023.01) |
| H10K 50/842 | (2023.01) |
| H10K 59/126 | (2023.01) |
| H10K 59/38 | (2023.01) |
| H10K 59/131 | (2023.01) |

(52) U.S. Cl.
CPC ....... *H10K 50/824* (2023.02); *H10K 50/8426* (2023.02); *H10K 50/858* (2023.02); *H10K 59/126* (2023.02); *H10K 59/131* (2023.02); *H10K 59/38* (2023.02)

(58) Field of Classification Search
CPC ........................ H01L 51/5246; H10K 59/8792
See application file for complete search history.

(56) References Cited

U.S. PATENT DOCUMENTS

| | | | | |
|---|---|---|---|---|
| 2011/0084290 A1* | 4/2011 | Nakamura | .......... | H01L 51/5246 257/89 |
| 2017/0125508 A1* | 5/2017 | Kim | ................ | H01L 51/56 |
| 2019/0140038 A1* | 5/2019 | Lee | ................ | H01L 51/5246 |
| 2019/0157618 A1* | 5/2019 | Park | ................ | H01L 51/5253 |
| 2021/0066648 A1* | 3/2021 | Chung | ................ | H10K 59/65 |

FOREIGN PATENT DOCUMENTS

| KR | 10-2010-0047457 A | 5/2010 |
|---|---|---|
| KR | 10-2016-0027538 A | 3/2016 |

* cited by examiner

*Primary Examiner* — Suberr L Chi
(74) *Attorney, Agent, or Firm* — Polsinelli PC

(57) ABSTRACT

An organic light emitting diode display device includes a first substrate, an organic light emitting diode including a first electrode, an organic layer and a second electrode and disposed on the first substrate, a conductive layer disposed on the organic light emitting diode, a second substrate disposed over the first substrate, a conductive black matrix disposed on a surface of the second substrate that faces the first substrate, a sealant boding the first substrate and the second substrate and a conductive fill material filled between the first substrate and the second substrate.

14 Claims, 15 Drawing Sheets

ORGANIC LIGHT EMITTING DIODE DISPLAY DEVICE HAVING CONDUCTIVE LAYER, CONDUCTIVE FILL MATERIAL AND CONDUCTIVE BLACK MATRIX

CROSS-REFERENCE TO RELATED APPLICATION

This application claims the priority of Korean Patent Application No. 10-2019-0114257 filed on Sep. 17, 2019, which is hereby incorporated by reference in its entirety.

BACKGROUND

Field of the Disclosure

The present disclosure relates to an organic light emitting diode (OLED) display device, and more particularly, to an OLED display device in which the transparency is improved by increasing a transmission area and a voltage drop of a second electrode is suppressed by simplifying the structure.

Description of the Background

With the development of information society, various demands for display devices for displaying images are increasing. In the field of display devices, flat panel display devices (FPDs), which are thin, light, and can have a large area, have been rapidly replacing bulky cathode ray tubes (CRTs). Examples of the FPDs include a liquid crystal display device (LCD), a plasma display panel (PDP), an OLED display device, an electrophoretic display device (ED), etc.

Among these FPDs, an OLED display device is a self-emission display device and has fast response time, high light emission efficiency, high luminance, and wide viewing angle. Particularly, the OLED display device may be formed even on a flexible substrate. Also, the OLED display device has advantages of a lower driving voltage, lower power consumption, and better color tone than a PDP or an inorganic electroluminescent (EL) display.

Recently, a transparent display device which enables a user in front of the transparent display device to see objects located behind the transparent display device through the transparent display device has been developed. For example, a transparent OLED display device is implemented as a transparent display device in which each pixel area includes an emission area that emits light and a transmission area that transmits external light. The pixel area has a trade-off relationship in which the transmission area decreases as the emission area increases and the emission area decreases as the transmission area increases. Thus, it is difficult to increase the aperture ratio of the emission area. Therefore, studies on a transparent display device in which the aperture ratio of an emission area can be increased without reducing a transmission area have continued.

SUMMARY

Accordingly, the present disclosure is to provide a display device in which the transparency is improved by increasing a transmission area and a voltage drop of a second electrode is suppressed by simplifying the structure.

According to an aspect of the present disclosure, there is provided an organic light emitting diode display device. The organic light emitting diode display device includes a first substrate. The organic light emitting diode display device further includes an organic light emitting diode including a first electrode, an organic layer and a second electrode and disposed on the first substrate. The organic light emitting diode display device further includes a conductive layer disposed on the organic light emitting diode. The organic light emitting diode display device further includes a second substrate disposed over the first substrate. The organic light emitting diode display device further includes a conductive black matrix disposed on a surface of the second substrate that faces the first substrate. The organic light emitting diode display device further includes a sealant boding the first substrate and the second substrate. The organic light emitting diode display device further includes a conductive fill material filled between the first substrate and the second substrate.

The second electrode may be in direct contact with the conductive layer.

The conductive layer may be in direct contact with the conductive fill material.

The conductive fill material may be in direct contact with the conductive black matrix.

The conductive layer may include one of selected from IGZO, ITO and IZO.

The conductive layer may have a higher refractive index than the second electrode.

The conductive black matrix may include copper, molybdenum, titanium, chromium, or an alloy thereof.

The organic light emitting diode display device may further include a plurality of color filters disposed in the conductive black matrix. The conductive black matrix may have a mesh shape in which the plurality of color filters are placed.

The organic light emitting diode display device may further include a transmission area corresponding an area except for an area where the organic light emitting diode and the conductive black matrix are disposed, the transmission area may transmit light from a back surface of the first substrate.

The organic layer, the second electrode and the conductive layer may be superimposed in the transmission area.

The organic light emitting diode display device may further include a thin film transistor connected to the first electrode of the organic light emitting diode.

The second electrode may be connected to a cathode power line.

The organic light emitting diode display device may further include a connection pattern overlapping with a portion of the first electrode and a repair line connected to the connection pattern. The repair line may be electrically connected to another first electrode adjacent to the first electrode.

According to an aspect of the present disclosure, there is provided an organic light emitting diode display device. The organic light emitting diode display device includes first and second substrates facing each other. The organic light emitting diode display device further includes an organic light emitting diode including a first electrode, an organic layer and a second electrode and disposed on the first substrate. The organic light emitting diode display device further includes a conductive layer contacting the second electrode. The organic light emitting diode display device further includes a conductive black matrix disposed on a surface of the second substrate that faces the first substrate. The organic light emitting diode display device further includes a conductive fill material electrically connecting the conductive layer and the conductive black matrix.

The organic light emitting diode display device may further include a plurality of color filters disposed in the conductive black matrix. The conductive black matrix may have a mesh shape in which the plurality of color filters are placed.

The conductive black matrix may be connected to a cathode power line.

The organic light emitting diode display device may further include a transmission area corresponding an area except for an area where the organic light emitting diode and the conductive black matrix are disposed. The organic layer, the second electrode and the conductive layer may be superimposed in the transmission area.

The conductive layer may have a higher refractive index than the second electrode.

The second electrode may be connected to a cathode power line.

The organic light emitting diode display device may further include a connection pattern overlapping with a portion of the first electrode and a repair line connected to the connection pattern. The repair line may be electrically connected to another first electrode adjacent to the first electrode.

According to the aspects of the present disclosure, in an OLED display device, a conductive layer in contact with a second electrode of an OLED is connected to a conductive black matrix using a conductive fill material filled therebetween. Therefore, it is possible to reduce a resistance of the second electrode and thus suppress a voltage drop.

Further, according to the aspects of the present disclosure, the OLED display device includes the conductive layer whose refractive index can be easily controlled by adjusting the composition ratio. The conductive layer may have a higher refractive index than the second electrode. Therefore, it is possible to reduce total reflection of light and thus possible to improve the luminous efficiency.

Further, according to the aspects of the present disclosure, the OLED display device does not include a cathode contact portion. Thus, it is possible to increase the size of a transmission area and thus possible to improve the transmittance.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
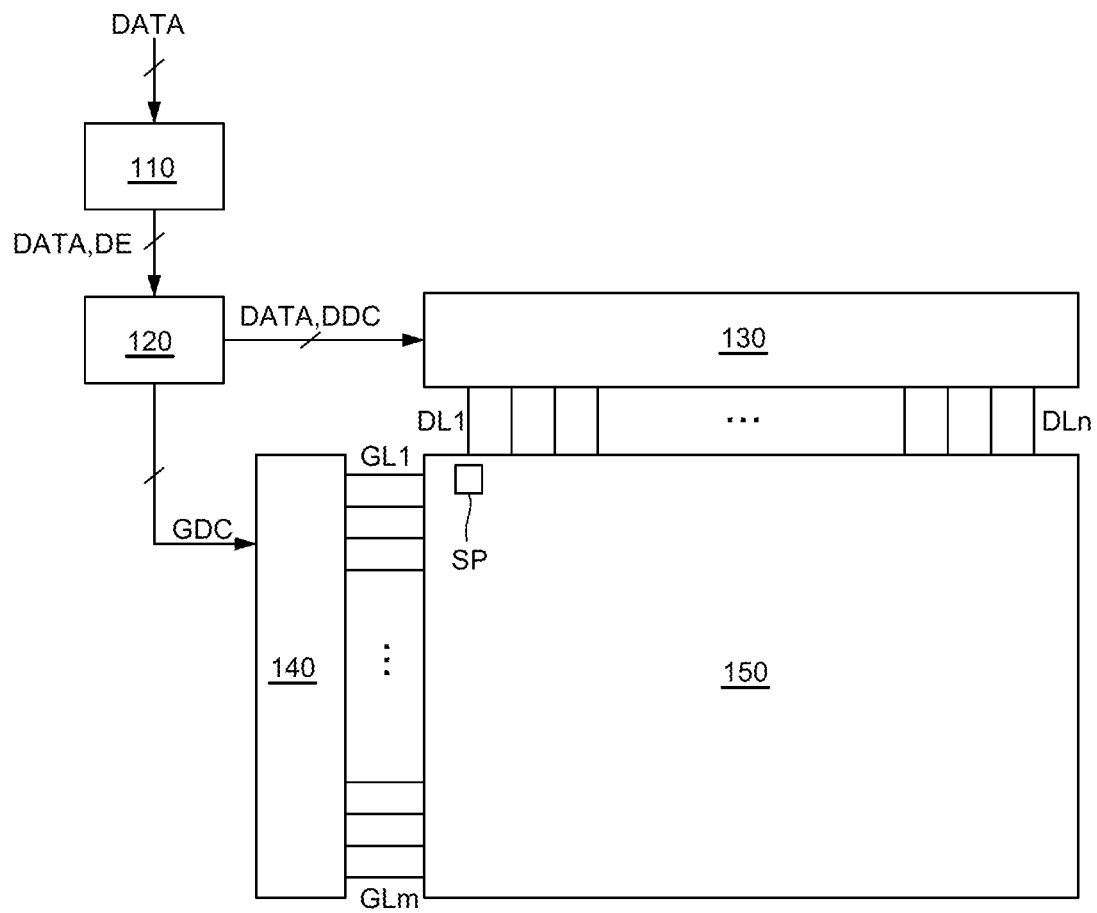
FIG. 1 is a schematic block diagram of an OLED display device.

Hereinafter, the exemplary aspects of the present disclosure will be described with reference to the accompanying drawings. Throughout the whole specification, the same reference numerals denote substantially the same elements. Further, in the following, a detailed explanation of known technologies or configurations related to the present disclosure may be omitted to avoid unnecessarily obscuring the subject matter of the present disclosure. Further, the names of elements used herein are chosen for ease of description and may be different from the names of parts used in actual products.

A display device according to the present disclosure may be an OLED display device, an LCD, an ED, and the like, but in the present disclosure, the OLED display device will be described as an example. The OLED display device includes a first electrode as an anode, a second electrode as a cathode, and an organic layer formed of an organic material between the first electrode and the second electrode. Therefore, the OLED display device is a self-emission display device in which holes from the first electrode and electrons from the second electrode are combined in the organic layer to form excitons which are hole-electron pairs. Therefore, the OLED display device emits light due to energy generated when the excitons return to the ground state.

Figure 2:
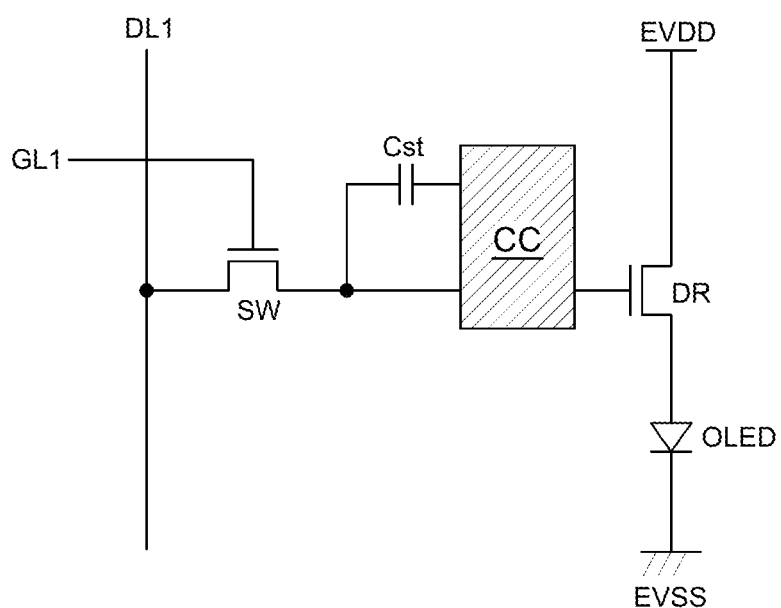
FIG. 2 schematically illustrates a circuit configuration of a sub-pixel.
Figure 3:
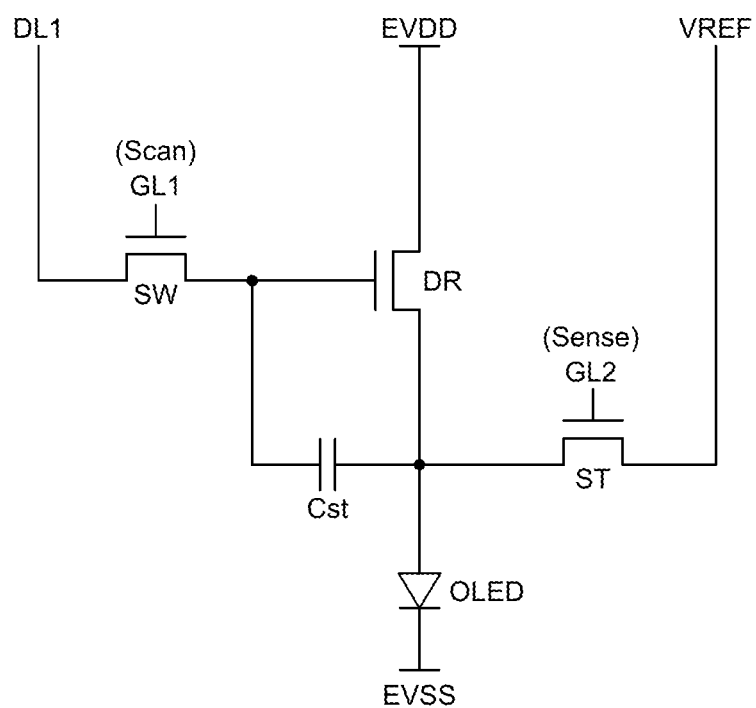
FIG. 3 illustrates an example of a detailed circuit configuration of the sub-pixel.

FIG. 1 is a schematic block diagram of an OLED display device, FIG. 2 schematically illustrates a circuit configuration of a sub-pixel, and FIG. 3 illustrates an example of a detailed circuit configuration of the sub-pixel.

As shown in FIG. 1, an OLED display device includes an image processer 110, a timing controller 120, a data driver 130, a scan driver 140 and a display panel 150.

The image processer 110 outputs a data enable signal DE together with a data signal DATA supplied from the outside. The image processer 110 may output at least one of a vertical synchronizing signal, a horizontal synchronizing signal and a clock signal in addition to the data enable signal DE, but the illustration of these signals will be omitted for convenience of explanation.

The timing controller 120 receives the data signal DATA together with driving signals including the data enable signal DE or at least one of the vertical synchronizing signal, the horizontal synchronizing signal and the clock signal from the image processer 110. The timing controller 120 outputs a gate timing control signal GDC for controlling an operation timing of the scan driver 140 and a data timing control signal DDC for controlling an operation timing of the data driver 130, based on the driving signals.

In response to the data timing control signal DDC supplied from the timing controller 120, the data driver 130 samples and latches the data signal DATA supplied from the timing controller 120. Then, the data driver 130 converts and outputs the signal into a gamma reference voltage. The data driver 130 outputs the data signal DATA through data lines DL1 to DLn. The data driver 130 may be configured in the form of an integrated circuit (IC).

In response to the gate timing control signal GDC supplied from the timing controller 120, the scan driver 140 outputs a scan signal. The scan driver 140 outputs a scan signal through gate lines GL1 to GLm. The scan driver 140 may be configured in the form of an integrated circuit (IC) or may be provided on the display panel 150 in a gate in panel (GIP) scheme.

The display panel 150 displays images in response to the data signal DATA and the scan signal supplied from the data driver 130 and the scan driver 140, respectively. The display panel 150 includes sub-pixels SP that are operated to display images.

The sub-pixels SP may include red, green and blue sub-pixels, or may include white, red, green, and blue sub-pixels. The sub-pixels SP may have one or more different emission areas depending on emission characteristics.

As shown in FIG. 2, each sub-pixel SP includes a switching transistor SW, a driving transistor DR, a capacitor Cst, a compensation circuit CC and an organic light emitting diode OLED.

In response to a scan signal supplied through a first gate line GL1, the switching transistor SW performs a switching operation to allow a data signal supplied through a data line DL to be stored as a data voltage in the capacitor Cst. The driving transistor DR operates to allow a driving current to flow between a power line EVDD (high-potential voltage) and a cathode power line EVSS (low-potential voltage) depending on the data voltage stored in the capacitor Cst. The organic light emitting diode OLED operates to emit light depending on a driving current formed by the driving transistor DR.

The compensation circuit CC is a circuit that is added inside a sub-pixel so as to compensate for a threshold voltage of the driving transistor DR. The compensation circuit CC includes at least one transistor. The compensation circuit CC has various configurations depending on an external compensation method. An example thereof will be described below.

As illustrated in FIG. 3, the compensation circuit CC includes a sensing transistor ST and a sensing line VREF (or a reference line). The sensing transistor ST is connected between a source electrode of the driving transistor DR and an anode electrode of the organic light emitting diode OLED (hereinafter, referred to as a sensing node). The sensing transistor ST operates to supply an initialization voltage (or sensing voltage) received through the sensing line VREF to the sensing node of the driving transistor DR. Otherwise, the sensing transistor ST operates to sense a voltage or current of the sensing node of the driving transistor DR or a voltage or current of the sensing line VREF.

One of a source electrode and a drain electrode of the switching transistor SW is connected to a data line DL and the other one is connected to a gate electrode of the driving transistor DR. One of a source electrode and a drain electrode of the driving transistor DR is connected to the power line EVDD and the other one is connected to a first electrode, which is an anode, of the organic light emitting diode OLED. The capacitor Cst includes a lower electrode connected to the gate electrode of the driving transistor DR and an upper electrode connected to the anode electrode of the organic light emitting diode OLED. The organic light emitting diode OLED includes the first electrode connected to one of the source electrode and the drain electrode of the driving transistor DR and a second electrode, as a cathode electrode, connected to the second power line EVSS. One of a source electrode and a drain electrode of the sensing transistor ST is connected to the sensing line VREF. Also, the other one of the source electrode and the drain electrode of the sensing transistor ST is connected to the first electrode of the organic light emitting diode OLED and the other one of the source electrode and the drain electrode of the driving transistor DR which is a sensing node.

An operation time of the sensing transistor ST may be similar/identical to or different from an operation time of the switching transistor SW depending on an external compensation algorithm (or configuration of the compensation circuit). For example, a gate electrode of the switching transistor SW may be connected to a first gate line GL1 and a gate electrode of the sensing transistor ST may be connected to a second gate line GL2. In this case, a scan signal Scan is transmitted to the first gate line GL1 and a sensing signal Sense is transmitted to the second gate line GL2. In another example, the first gate line GL1 connected to the gate electrode of the switching transistor SW and the second gate line GL2 connected to the gate electrode of the sensing transistor ST may be connected to be commonly shared.

The sensing line VREF may be connected to the data driver. In this case, the data driver may sense a sensing node of each sub-pixel and generate a sensing result in real time, in a non-display time of an image, or in a time period of N-th frame (N is an integer equal to or greater than 1). Meanwhile, the switching transistor SW and the sensing transistor ST may be turned on at the same time. In this case, a sensing operation through the sensing line VREF and a data output operation of outputting a data signal may be separated (differentiated) from each other on a basis of a time-division scheme of the data driver.

Further, a compensation target according to the sensing result may be a digital data signal, an analog data signal, a gamma voltage, or the like. Furthermore, the compensation circuit which generates a compensation signal (or a compensation voltage) based on the sensing result may be provided inside the data driver or inside the timing controller. Otherwise, the compensation circuit may be implemented as a separate circuit.

FIG. 3 illustrates an example of a sub-pixel having a 3T(Transistor)1C(Capacitor) structure including the switching transistor SW, the driving transistor DR, the capacitor Cst, the organic light emitting diode OLED, and the sensing transistor ST. However, if the compensation circuit CC is added, a sub-pixel may be configured having a 3T2C, 4T2C, 5T2C, or 6T2C structure.

Figure 4:
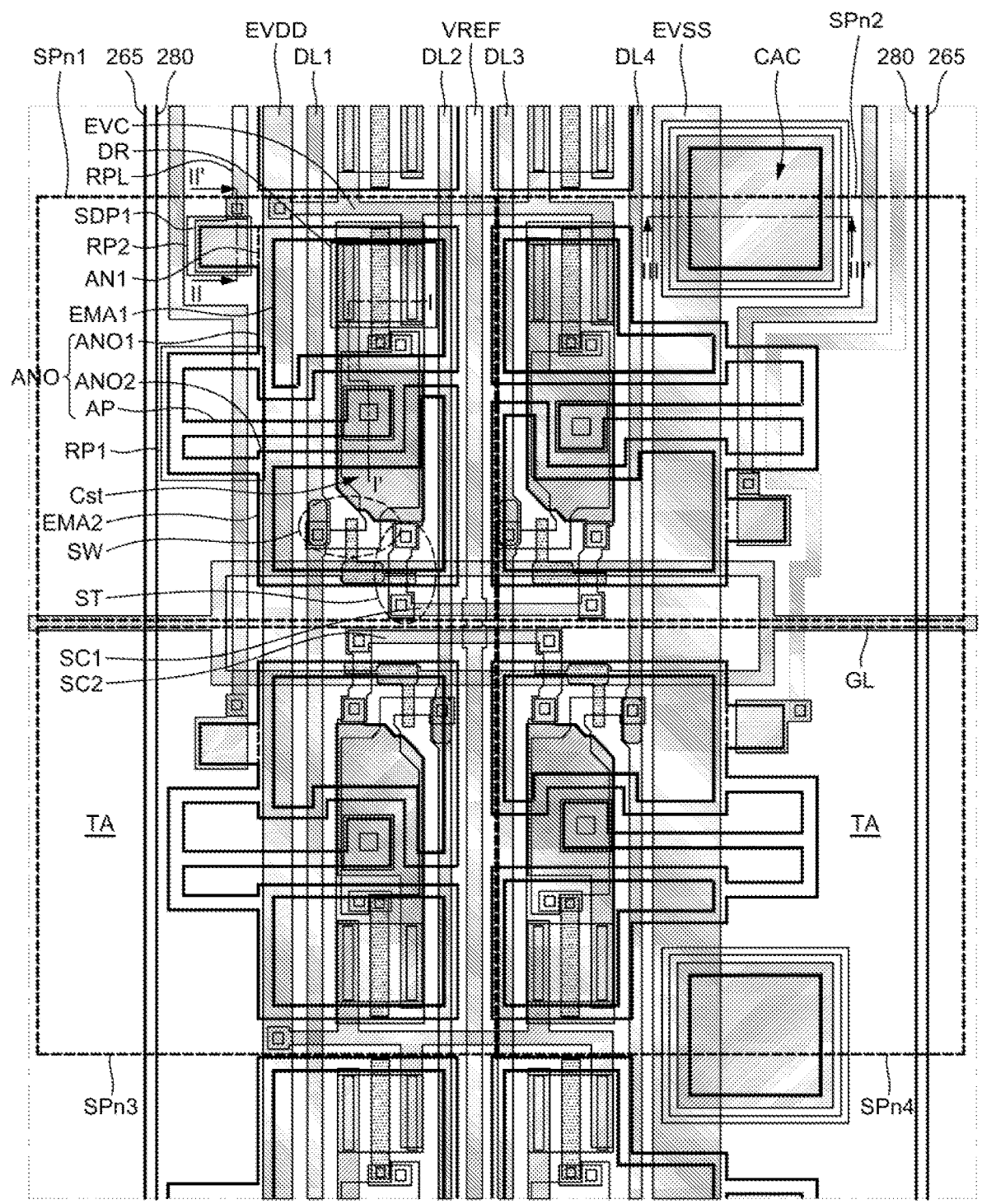
FIG. 4 is a plan view of an OLED display device according to a first aspect of the present disclosure.
Figure 5:
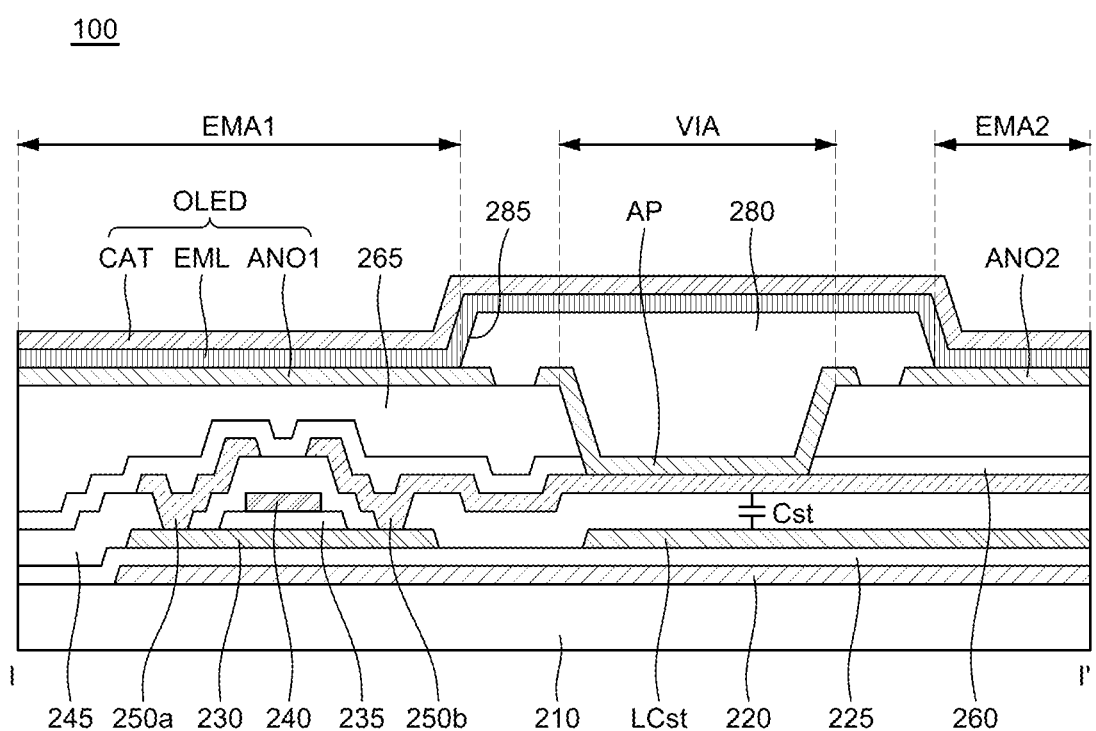
FIG. 5 is a cross-sectional view as taken along a line I-I' of FIG. 4.
Figure 6:
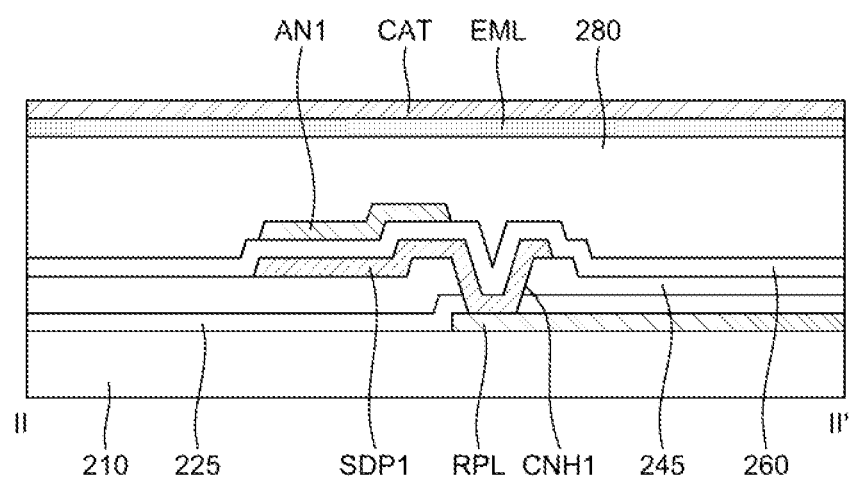
FIG. 6 is a cross-sectional view as taken along a line II-II' of FIG. 4.
Figure 7:
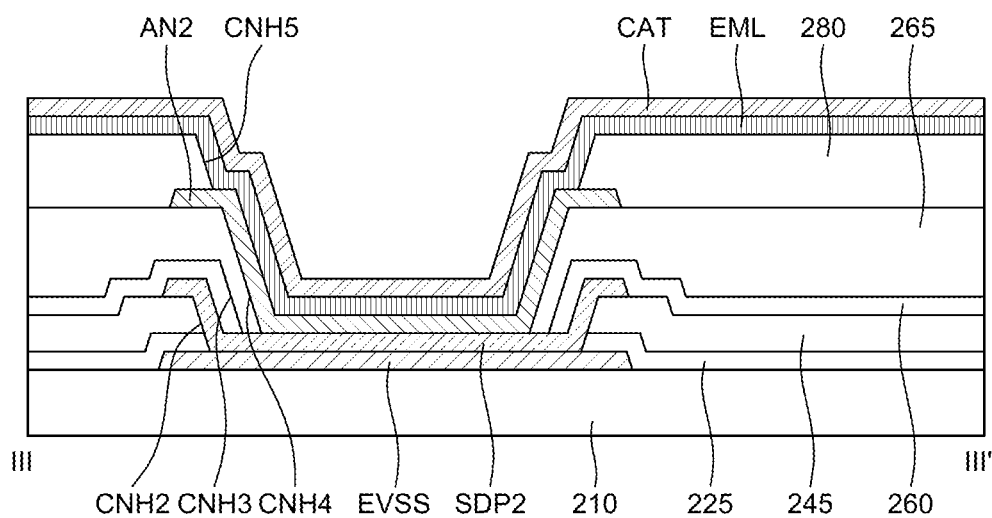
FIG. 7 is a cross-sectional view as taken along a line III-III' of FIG. 4.

FIG. 4 is a plan view of an OLED display device according to a first aspect of the present disclosure and FIG. 5 is a cross-sectional view as taken along a line I-I' of FIG. 4. FIG. 6 is a cross-sectional view as taken along a line II-II' of FIG. 4 and FIG. 7 is a cross-sectional view as taken along a line III-III' of FIG. 4.

Referring to FIG. 4, in the OLED display device of the present disclosure, an area where a gate line GL crosses first to fourth data lines DL1 to DL4 is first to fourth sub-pixels SPn1 to SPn4. Each of the first to fourth sub-pixels SPn1 to SPn4 includes first and second emission areas EMA1 and EMA 2 and a transmission area TA.

Specifically, the first to fourth sub-pixels SPn1 to SPn4 connected to the first to fourth data lines DL1 to DL4, respectively, are commonly connected to the sensing line VREF. The sensing line VREF is connected to the first sub-pixel SPn1 and the third sub-pixel SPn3 through a first sensing connection line SC1 and the second sub-pixel SPn2 and the fourth sub-pixel SPn4 through a second sensing connection line SC2. The power line EVDD is disposed on one side of the first sub-pixel SPn1 and the second sub-pixel SPn2, and each of the first to fourth sub-pixels SPn1 to SPn4 is connected to the power line EVDD through a power connection line EVC. The cathode power line EVSS is disposed on one side of the third and fourth sub-pixels SPn3 and SPn4 and connected to the second electrode which is a cathode (not illustrated).

A first anode electrode ANO1 is disposed in the first emission area EMA1 of each sub-pixel, and a second anode electrode ANO2 is disposed in the second emission area EMA2 so that a first electrode ANO of an organic light emitting diode is disposed. The first anode electrode ANO1 and the second anode electrode ANO2 are connected to each other to form the first electrode ANO in each sub-pixel. Each sub-pixel includes the driving transistor DR, the capacitor Cst, the sensing transistor ST, and the switching transistor SW. The driving transistor DR is superimposed on the first emission area EMA1 and the sensing transistor ST and the switching transistor SW are superimposed on the second emission area EMA2.

The sensing line VREF is connected to the respective sensing transistors STs of the first to fourth sub-pixels SPn1 to SPn4 through the first and second sensing connection lines SC1 and SC2. The power line EVDD is connected to the respective driving transistors DRs of the first and second sub-pixels SPn1 and SPn2 through the power connection line EVC. The power connection line EVC is connected to each of the first to fourth sub-pixels SPn1 to SPn4. The gate lines GL are connected to the sensing and switching transistors STs and SWs of the first to fourth sub-pixels SPn1 to SPn4, respectively.

The first electrode ANO includes the first anode electrode ANO1, the second anode electrode ANO2 and an anode connection electrode AP. The anode connection electrode AP is connected to the driving transistor DR and branched to the first anode electrode ANO1 and the second anode electrode ANO2. The first anode electrode ANO1, the second anode electrode ANO2 and the anode connection electrode AP are configured as one body.

A first repair portion RP1 is a portion overlapping with a connection area between the first anode electrode ANO1 and the second anode electrode ANO2 of the first electrode ANO. The first anode electrode ANO1 in the first emission area EMA1 or the second anode electrode ANO2 in the second emission area EMA2 is cut in the first repair portion RP1, when any one emission area malfunctions due to impurities which may be generated during a process. Thus, the sub-pixel may be repaired.

Also, a second repair portion RP2 is a portion overlapping with the first anode electrode ANO1 or the second anode electrode ANO2. When any one emission area malfunctions due to impurities which may be generated during a process, the first anode electrode ANO1 or the second anode electrode ANO2 is cut in the first repair portion RP1. Then, the cut anode electrode is connected to a first electrode (anode electrode) of another sub-pixel adjacent thereto in the second repair portion RP2 to repair the sub-pixel. In the second repair portion RP2, a repair line RPL extended from one side of the power line EVDD to the adjacent sub-pixel so as to be parallel with the power line EVDD is disposed.

As described above, the first electrode ANO is branched to the first anode electrode ANO1 in the first emission area EMA1 and the second anode electrode ANO2 in the second emission area EMA2 to have the first repair portion RP1. Hereinafter, a connection relationship of the first electrode ANO will be described in detail.

Referring to FIG. 5, a cross-sectional structure of the first sub-pixel SPn1 will be described. In the OLED display device according to the present disclosure, a light-shielding layer 220 is disposed on a first substrate 210. The light-shielding layer 220 blocks light incident from the outside and suppresses the generation of photoelectric current in a thin film transistor. A buffer layer 225 is disposed on the light-shielding layer 220. The buffer layer 225 protects a thin film transistor, which is to be formed in a subsequent process, from impurities, such as alkali ions, flowing out from the light-shielding layer 220. The buffer layer 225 may be silicon oxide (SiOX), silicon nitride (SiNx) or a multilayer thereof.

A semiconductor layer 230 of the driving transistor DR is disposed on the buffer layer 225 and a capacitor lower electrode LCst is also disposed over the buffer layer 225 and is disposed apart from the semiconductor layer 230. The semiconductor layer 230 and the capacitor lower electrode LCst may be formed of a silicon semiconductor or an oxide semiconductor. The silicon semiconductor may include amorphous silicon or crystallized polycrystalline silicon. The polycrystalline silicon has a high mobility (e.g., 100 $cm^2/Vs$ or more), low power consumption, and excellent reliability. Thus, the polycrystalline silicon may be applied to a gate driver and/or a multiplexer (MUX) for use in a driving element or applied to a driving TFT in each pixel. Meanwhile, the oxide semiconductor has a low off-current. Thus, the oxide semiconductor is suitable for a switching TFT that has a short on-time and a long off-time. Further, the oxide semiconductor increases a voltage hold time of the pixel due to the low off-current. Thus, the oxide semiconductor is suitable for a display device requiring a low-speed drive and/or low power consumption. Furthermore, the semiconductor layer 230 includes a drain region and a source region each containing p-type or n-type impurities and also includes a channel between the drain region and the source region. The capacitor lower electrode LCst may be doped with impurities and become conductive.

A gate insulating layer 235 is disposed on the semiconductor layer 230 and the capacitor lower electrode LCst. The gate insulating layer 235 may be silicon oxide (SiOx), silicon nitride (SiNx) or a multilayer thereof. A gate electrode 240 is disposed on the gate insulating layer 235 corresponding to a certain region of the semiconductor layer 230, i.e., the channel when impurities are injected. The gate electrode 240 is formed of any one selected from the group consisting of molybdenum (Mo), aluminum (Al), chromium (Cr), gold (Au), titanium (Ti), nickel (Ni), neodymium (Nd) and copper (Cu), or an alloy thereof. Further, the gate electrode 240 may be a multilayer formed of any one selected from the group consisting of molybdenum (Mo), aluminum (Al), chromium (Cr), gold (Au), titanium (Ti), nickel (Ni), neodymium (Nd) and copper (Cu), or an alloy thereof. For example, the gate electrode 240 may be a dual layer of molybdenum/aluminum-neodymium or molybdenum/aluminum.

An interlayer insulating layer 245 that insulates the gate electrode 240 is disposed on the gate electrode 240. The interlayer insulating layer 245 may be a silicon oxide (SiOx) layer, a silicon nitride (SiNx) layer or a multilayer thereof. A source electrode 250a and a drain electrode 250b are disposed on the interlayer insulating layer 245. The source electrode 250a and the drain electrode 250b are connected to the semiconductor layer 230 through a contact hole through which the source region of the semiconductor layer 230 is exposed. Each of the source electrode 250a and the drain electrode 250b may be formed as a single layer or a multilayer. If each of the source electrode 250a and the drain electrode 250b is formed as a single layer, it may be formed of any one selected from the group consisting of molybdenum (Mo), aluminum (Al), chromium (Cr), gold (Au), titanium (Ti), nickel (Ni), neodymium (Nd) and copper (Cu), or an alloy thereof. Further, if each of the source electrode 250a and the drain electrode 250b is formed as a multilayer, it may be formed as a dual layer of molybdenum/aluminum-neodymium or a triple layer of titanium/aluminum/titanium, molybdenum/aluminum/molybdenum or molybdenum/aluminum-neodymium/molybdenum. Therefore, the driving transistor DR is configured including the semiconductor layer 230, the gate electrode 240, the source electrode 250a and the drain electrode 250b. Also, the capacitor Cst is configured including the capacitor lower electrode LCst and the drain electrode 250b serving as a capacitor upper electrode.

A first protection layer 260 is disposed on the first substrate 210 including the driving transistor DR and the capacitor Cst. The first protection layer 260 is an insulating layer protecting the elements under the first protection layer 260 and may be a silicon oxide (SiOx) layer, a silicon nitride (SiNx) layer, or a multilayer thereof. An overcoat layer 265 is disposed on the first protection layer 260. The overcoat layer 265 may be a planarization layer for reducing a step of an underlying structure and may be formed of an organic material such as polyimide, benzocyclobutene series resin and acrylate. The overcoat layer 265 may be formed through a spin-on glass (SOG) method for coating the organic material in a liquid state and then curing the organic material. A via hole VIA is located in a part of the overcoat layer 265 and the first protection layer 260 and the drain electrode 250b is exposed through the via hole VIA.

The organic light emitting diode OLED is disposed on the overcoat layer 265. More specifically, the first anode electrode ANO1 and the second anode electrode ANO2 are disposed on the overcoat layer 265. The first anode electrode ANO1 and the second anode electrode ANO2 serve as pixel electrodes and are connected to the drain electrode 250b of the driving transistor DR through the anode connection electrode AP connected to the first anode electrode ANO1 and the second anode electrode ANO2. The first anode electrode ANO1 and the second anode electrode ANO2 are anodes and may be formed of a transparent conductive material such as indium tin oxide (ITO), indium zinc oxide (IZO) or zinc oxide (ZnO). An OLED display device 100 according to the present disclosure has a top-emission type structure, and the first anode electrode ANO1 and the second anode electrode ANO2 may be configured as a reflective electrode. Therefore, the first anode electrode ANO1 and the second anode electrode ANO2 may further include a reflective layer (not illustrated). The reflective layer may be formed of aluminum (Al), copper (Cu), silver (Ag), nickel (Ni), or an alloy thereof. The reflective layer may be formed of APC (silver/palladium/copper alloy).

A bank layer 280 is disposed on the first substrate 210 including the first anode electrode ANO1 and the second anode electrode ANO2. The bank layer 280 is disposed between pixels. The bank layer 280 is formed of an organic material such as polyimide, benzocyclobutene series resin and acrylate. The bank layer 280 includes an opening 285 through which the first anode electrode ANO1 and the second anode electrode ANO2 is exposed. An organic layer EML in contact with the first anode electrode ANO1 and the second anode electrode ANO2 is disposed on the entire surface of the first substrate 210. The organic layer EML is a layer in which electrons and holes are combined to emit light and may include a hole injection layer or a hole transport layer between the organic layer EML and the first electrode ANO. The organic layer EML may further include an electron transport layer or an electron injection layer on the organic layer EML.

A second electrode CAT is disposed on the organic layer EML. The second electrode CAT is disposed on the entire surface of an active area A/A and serves as a cathode electrode. The second electrode CAT may be formed of magnesium (Mg), calcium (Ca), aluminum (Al), silver (Ag), or an alloy thereof each having a low work function or may be formed of a transparent conductive oxide such as IZO. The second electrode CAT may be a transmissive electrode and may be thin enough to transmit light.

Meanwhile, in the first sub-pixel SPn1 of the present disclosure, the drain electrode 250b of the driving transistor DR is connected to the first anode electrode ANO1 and the second anode electrode ANO2 through the anode connection electrode AP. Specifically, the anode connection electrode AP is connected to the drain electrode 250b through the via hole VIA formed in the first protection layer 260 and the overcoat layer 265. The anode connection electrode AP connected to the drain electrode 250b of the driving transistor DR is extended to the first repair portion RP1. As shown in FIG. 4, the anode connection electrode AP is branched to the first anode electrode ANO1 and the second anode electrode ANO2 in the first repair portion RP1. The first anode electrode ANO1 or the second anode electrode ANO2 may be cut in the first repair portion RP1, when any one emission area malfunctions due to impurities which may be generated during a process. Thus, the emission area may be repaired.

Meanwhile, in the present disclosure, the second repair portion RP2 connected to the first anode electrode ANO1 or the second anode electrode ANO2 is disposed. In the following, the second repair portion RP2 connected to the first anode electrode ANO1 will be described as an example.

Referring to FIG. 6, in the second repair portion RP2, the repair line RPL is disposed on the first substrate 210 and the buffer layer 225 and the interlayer insulating layer 245 are disposed on the repair line RPL. The buffer layer 225 and the interlayer insulating layer 245 include a first contact hole CNH1 through which the repair line RPL under the buffer layer 225 and the interlayer insulating layer 245 is exposed. A first connection pattern SDP1 in contact with the repair line RPL through the first contact hole CNH1 is disposed on the interlayer insulating layer 245. The first connection pattern SDP1 is formed of the same material as a source electrode. The first protection layer 260 is disposed on the first connection pattern SDP1, and a first anode connection pattern AN1 superimposed on the first connection pattern SDP1 is disposed on the first protection layer 260. As shown in FIG. 4, the first anode connection pattern AN1 is formed as one body with the first anode electrode ANO1 in the first emission area EMA1. The bank layer 280, the organic layer EML and the second electrode CAT are laminated in sequence on the first anode connection pattern AN1.

When any one emission area malfunctions due to impurities which may be generated during a process, the first anode electrode ANO1 of a sub-pixel is cut in the first repair portion RP1. Then, the cut anode is connected to a first electrode of another sub-pixel adjacent thereto in the second repair portion RP2 to repair the sub-pixel. Specifically, the first protection layer 260 between the first connection pattern SDP1 and the first anode connection pattern AN1 may be removed by irradiating a laser beam to the second repair portion RP2. In this case, the first connection pattern SDP1 may be brought into contact with the first anode connection pattern AN1 and electrically connected thereto. Therefore, a voltage applied to a first electrode of another adjacent sub-pixel (e.g., a sub-pixel under the third sub-pixel SPn3) can be applied to the first anode electrode ANO1 in the first emission area EMA1 of the first sub-pixel SPn1 to repair the sub-pixel.

Meanwhile, as shown in FIG. 4, in the present disclosure, the cathode power line EVSS for applying a low-potential voltage to the second electrode CAT is disposed. The cathode power line EVSS is connected to the second electrode CAT superimposed on the cathode power line EVSS in a cathode contact portion CAC.

Specifically, referring to FIG. 7, in the cathode contact portion CAC, the cathode power line EVSS is disposed on the first substrate 210. Also, the buffer layer 225 and the interlayer insulating layer 245 are disposed on the cathode power line EVSS. The buffer layer 225 and the interlayer insulating layer 245 include a second contact hole CNH2 through which the cathode power line EVSS under the buffer layer 225 and the interlayer insulating layer 245 is exposed. A second connection pattern SDP2 connected to the cathode power line EVSS through the second contact hole CNH2 is disposed on the interlayer insulating layer 245. The second connection pattern SDP2 is formed of the same material as a source electrode. The first protection layer 260 is disposed on the second connection pattern SDP2, and the first protection layer 260 includes a third contact hole CNH3 through which the second connection pattern SDP2 under the first protection layer 260 is exposed. The overcoat layer 265 is disposed on the first protection layer 260 and includes a fourth contact hole CNH4 through which the second connection pattern SDP2 under the overcoat layer 265 is exposed. A second anode connection pattern AN2 is disposed on the overcoat layer 265 and connected to the second connection pattern SDP2 through the third and fourth contact holes CNH3 and CNH4. The bank layer 280 is disposed on the second anode connection pattern AN2 and includes a fifth contact hole CNH5 through which the second anode connection pattern AN2 under the bank layer 280 is exposed. The organic layer EML and the second electrode CAT are laminated in sequence on the bank layer 280.

The cathode contact portion CAC functions to reduce a resistance while applying a low-potential voltage to the second electrode CAT. Therefore, the second electrode CAT and the cathode power line EVSS may be connected to each other by selectively irradiating a laser beam to the cathode contact portion CAC to reduce a resistance of the second electrode CAT. Specifically, if a laser beam is irradiated to the cathode contact portion CAC, the organic layer EML is removed. Thus, the second electrode CAT may be brought into contact with the second anode connection pattern AN2 and electrically connected thereto. Therefore, the second electrode CAT may be connected to the cathode power line EVSS through the second anode connection pattern AN2 so that a resistance of the second electrode CAT can be reduced.

Figure 8:
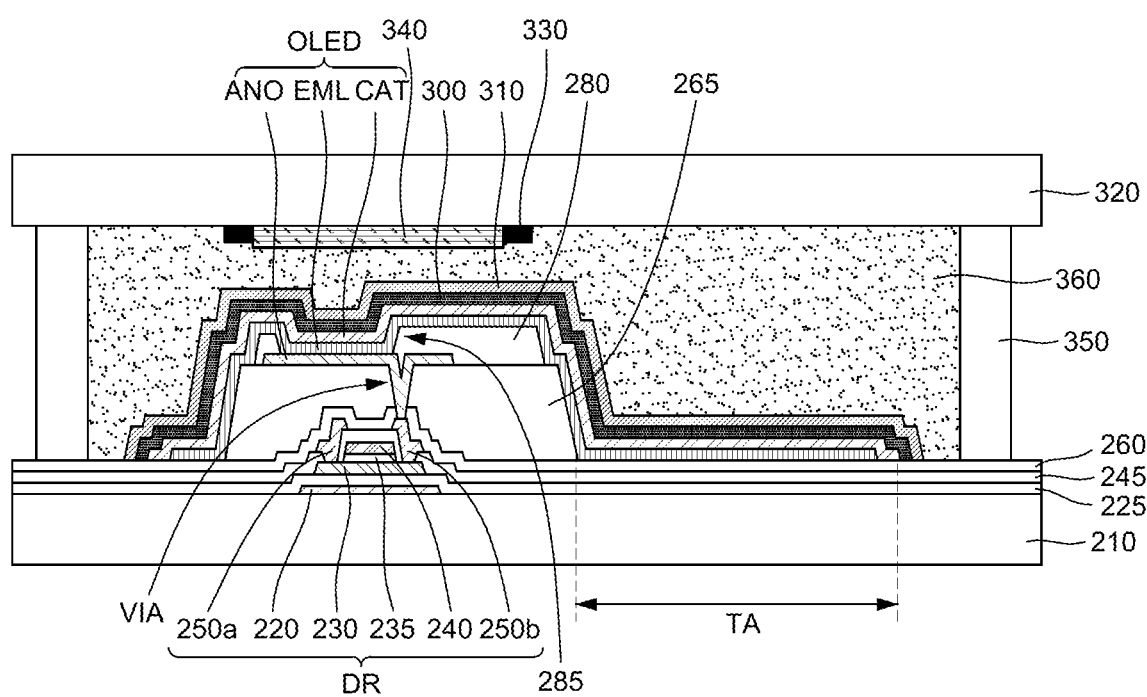
FIG. 8 is a cross-sectional view of the OLED display device according to the first aspect of the present disclosure.

FIG. 8 is a cross-sectional view of the OLED display device according to the first aspect of the present disclosure. FIG. 8 shows the overall cross-sectional shape of the OLED display device, and a plurality of sub-pixels and a plurality of transmission areas are disposed inside the OLED display device. However, an example where only a sub-pixel and a transmission area are disposed will be described. Also, parts identical or corresponding to those described above will be assigned the same reference numerals and will be briefly described.

Referring to FIG. 8, in the OLED display device according to the first aspect of the present disclosure, the light-shielding layer 220 is disposed on the first substrate 210. Also, the buffer layer 225 is disposed on the light-shielding layer 220. The semiconductor layer 230 of the driving transistor DR is disposed on the buffer layer 225, and the gate insulating layer 235 is disposed on the semiconductor layer 230. The gate electrode 240 is disposed on the gate insulating layer 235 corresponding to a certain region of the semiconductor layer 230, i.e., the channel. The interlayer insulating layer 245 is disposed on the gate electrode 240, and the source electrode 250*a* and the drain electrode 250*b* are disposed on the interlayer insulating layer 245. Therefore, the driving transistor DR is configured including the semiconductor layer 230, the gate electrode 240, the source electrode 250*a* and the drain electrode 250*b*.

The first protection layer 260 is disposed on the first substrate 210 including the driving transistor DR, and the overcoat layer 265 is disposed on the first protection layer 260. The overcoat layer 265 includes the via hole VIA through which the first protection layer 260 is exposed to expose the drain electrode 250*b*. The overcoat layer 265 is not disposed in the transmission area TA. Thus, it is possible to suppress a yellowish phenomenon of transmitted light caused by the overcoat layer 265. The organic light emitting diode OLED is disposed on the overcoat layer 265. More specifically, the first electrode ANO is disposed on the overcoat layer 265 and connected to the drain electrode 250*b* of the driving transistor DR through the via hole VIA. The bank layer 280 is disposed on the overcoat layer 265 on which the first electrode ANO has been formed. The bank layer 280 includes the opening 285 through which the first electrode ANO is exposed. Like the overcoat layer 265, the bank layer 280 is not disposed in the transmission area TA. Thus, it is possible to suppress a yellowish phenomenon of transmitted light caused by the bank layer 280.

The organic layer EML in contact with the first electrode ANO is disposed on the bank layer 280. The second electrode CAT is disposed on the organic layer EML. The organic layer EML and the second electrode CAT are formed entirely in the transmission area TA. Therefore, the organic light emitting diode OLED is configured including the first electrode ANO, the organic layer EML and the second electrode CAT.

Meanwhile, a capping layer 300 is disposed on the second electrode CAT. The capping layer 300 functions as a protection layer to suppress the oxidation of the second electrode CAT caused by moisture and oxygen from the outside. Also, the capping layer 300 functions as a light compensation layer to reduce the loss of light emitted from the organic layer EML when the light passes through the second electrode CAT to the atmosphere and improve the luminous efficiency. The capping layer 300 may be formed of an organic material. A second protection layer 310 is disposed on the capping layer 300. The second protection layer 310 has the same configuration as the above-described first protection layer 260 and protects the organic light emitting diode OLED under the second protection layer 310.

A second substrate 320 is disposed to face the first substrate 210. The second substrate 320 may be formed as a transparent substrate to transmit light. A black matrix 330 and a color filter 340 are disposed on a surface of the second substrate 320, i.e., a surface facing the first substrate 210. The color filter 340 changes the color of light emitted from the organic layer EML. For example, the color filter 340 may change white light emitted from the organic layer EML into red, green or blue light. The black matrix 330 is disposed around the color filter 340. The black matrix 330 functions to suppress color mixing between sub-pixels and improve the contrast. The first substrate 210 and the second substrate 320 are bonded to each other using a sealant 350 coated on the edges of the first substrate 210. Here, a fill material 360 is filled between the first substrate 210 and the second substrate 320.

As described above, the OLED display device according to the first aspect of the present disclosure includes repair portions. Thus, when a sub-pixel malfunctions or is detected as being defective, it can be repaired. Further, a cathode power line is connected to a second electrode, and, thus, it is possible to reduce a resistance of the second electrode and thus possible to suppress a voltage drop of the second electrode.

Figure 9:
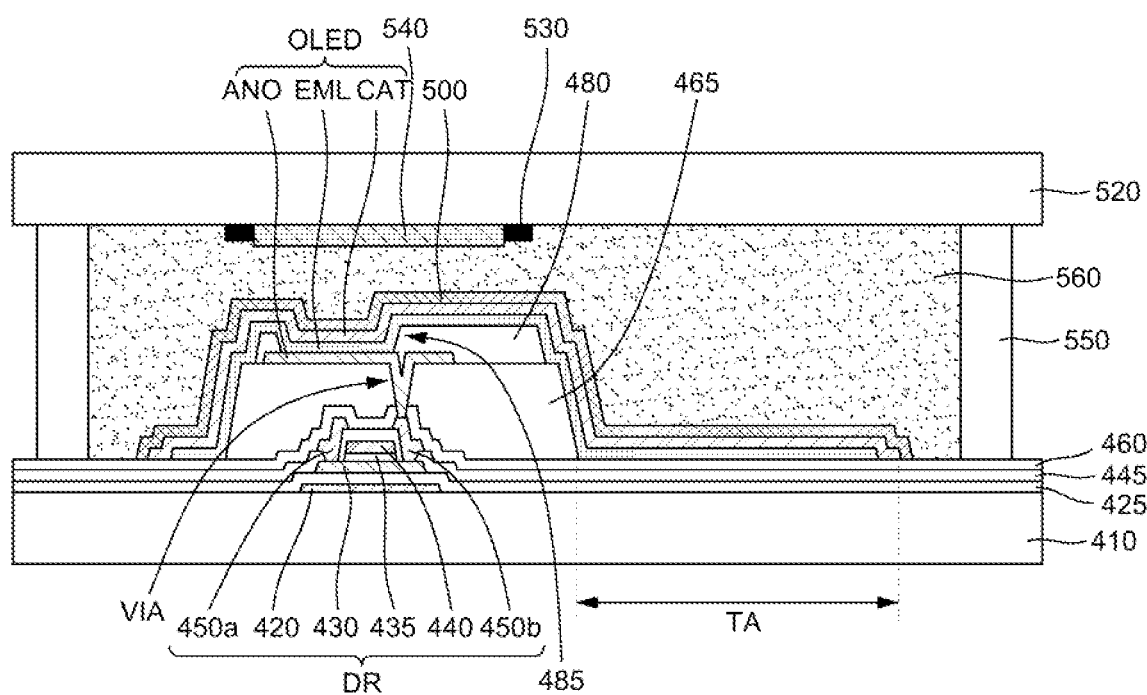
FIG. 9 is a cross-sectional view of an OLED display device according to a second aspect of the present disclosure.
Figure 10:
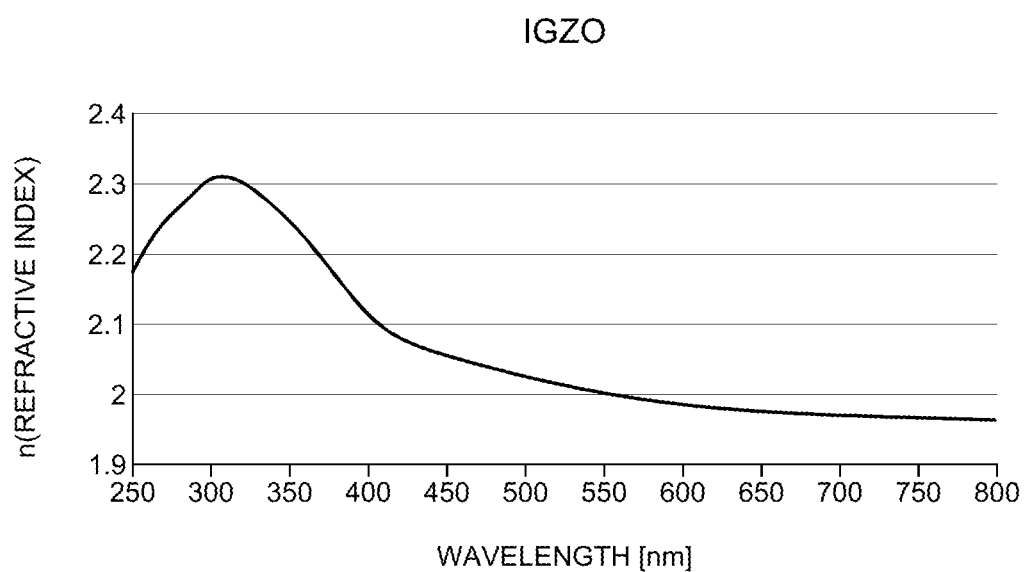
FIG. 10 is a graph showing the refractive index of IGZO depending on the wavelength range.
Figure 11:
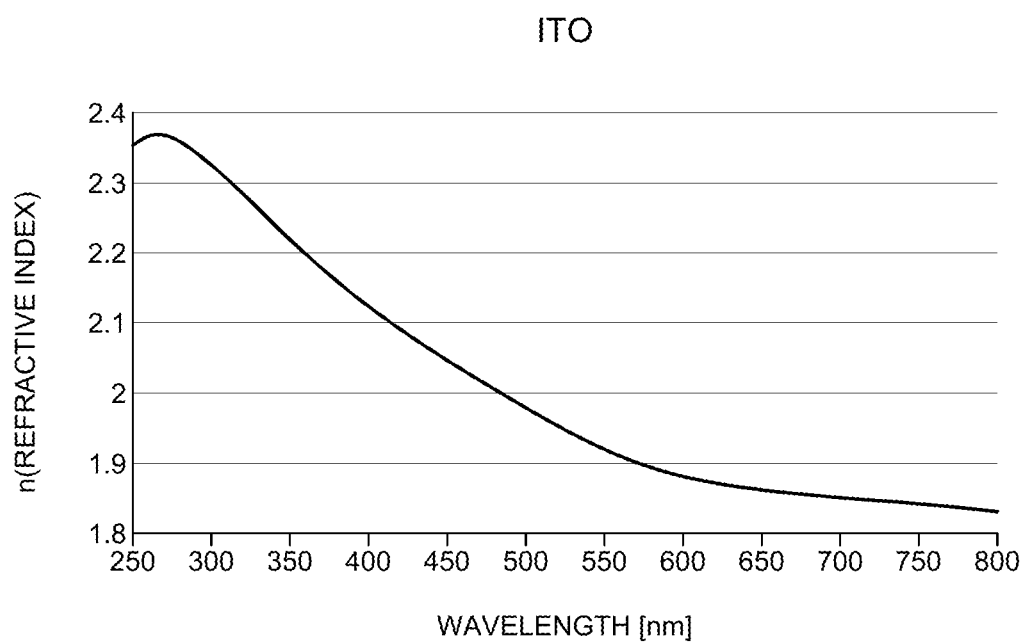
FIG. 11 is a graph showing the refractive index of ITO depending on the wavelength range.
Figure 12:
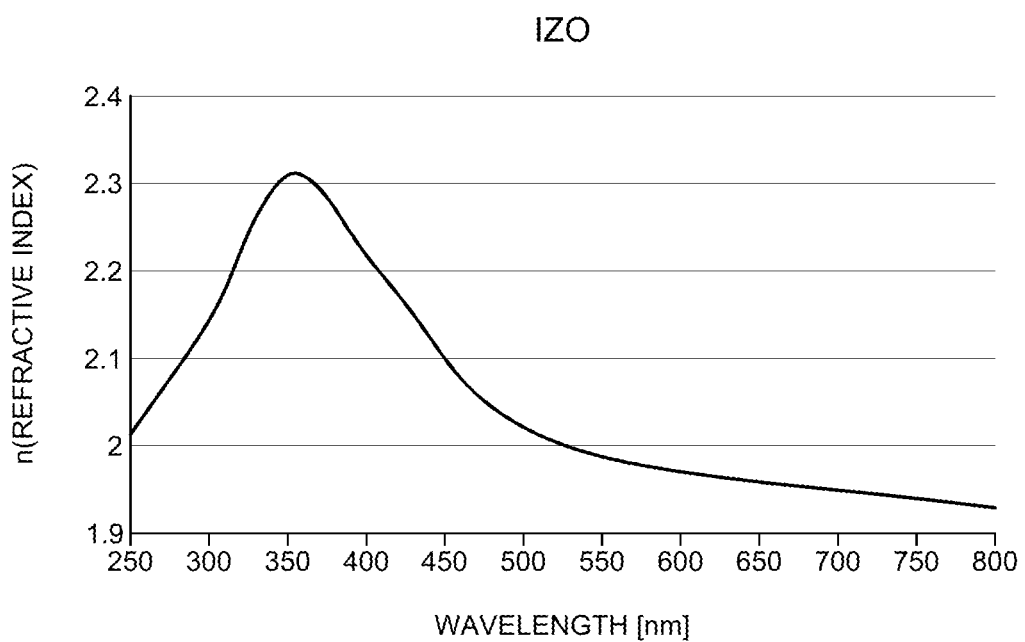
FIG. 12 is a graph showing the refractive index of IZO depending on the wavelength range.
Figure 13:
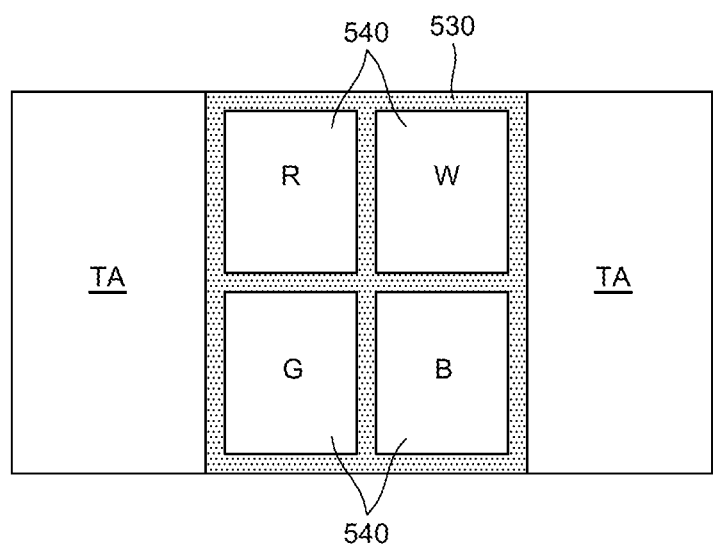
FIG. 13 and FIG. 14 are plan views illustrating a plane layout of a black matrix according to the second aspect of the present disclosure.
Figure 14:
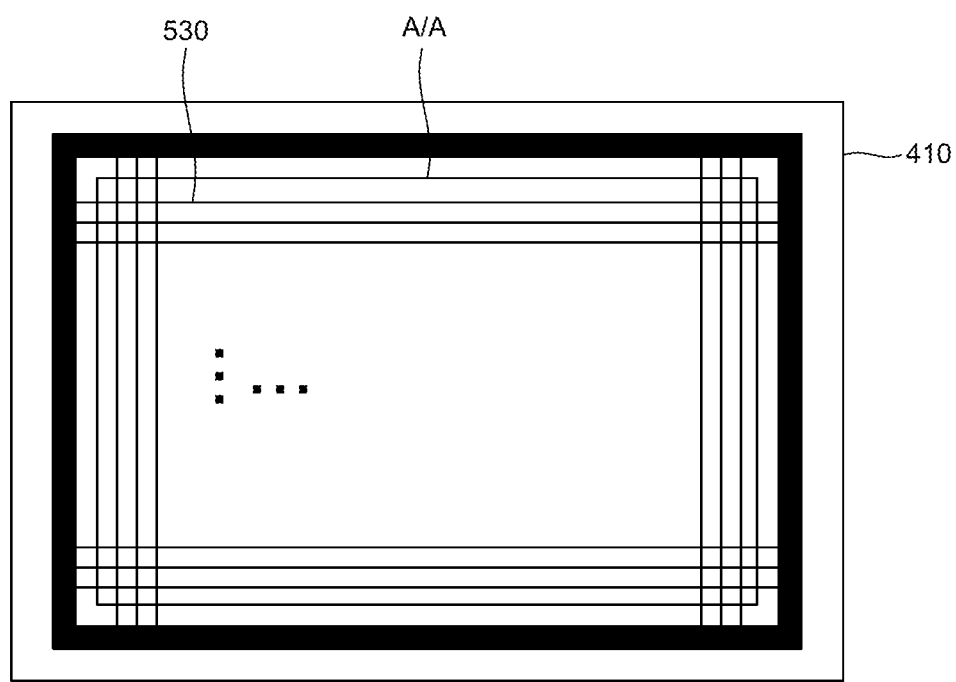
Figure 15:
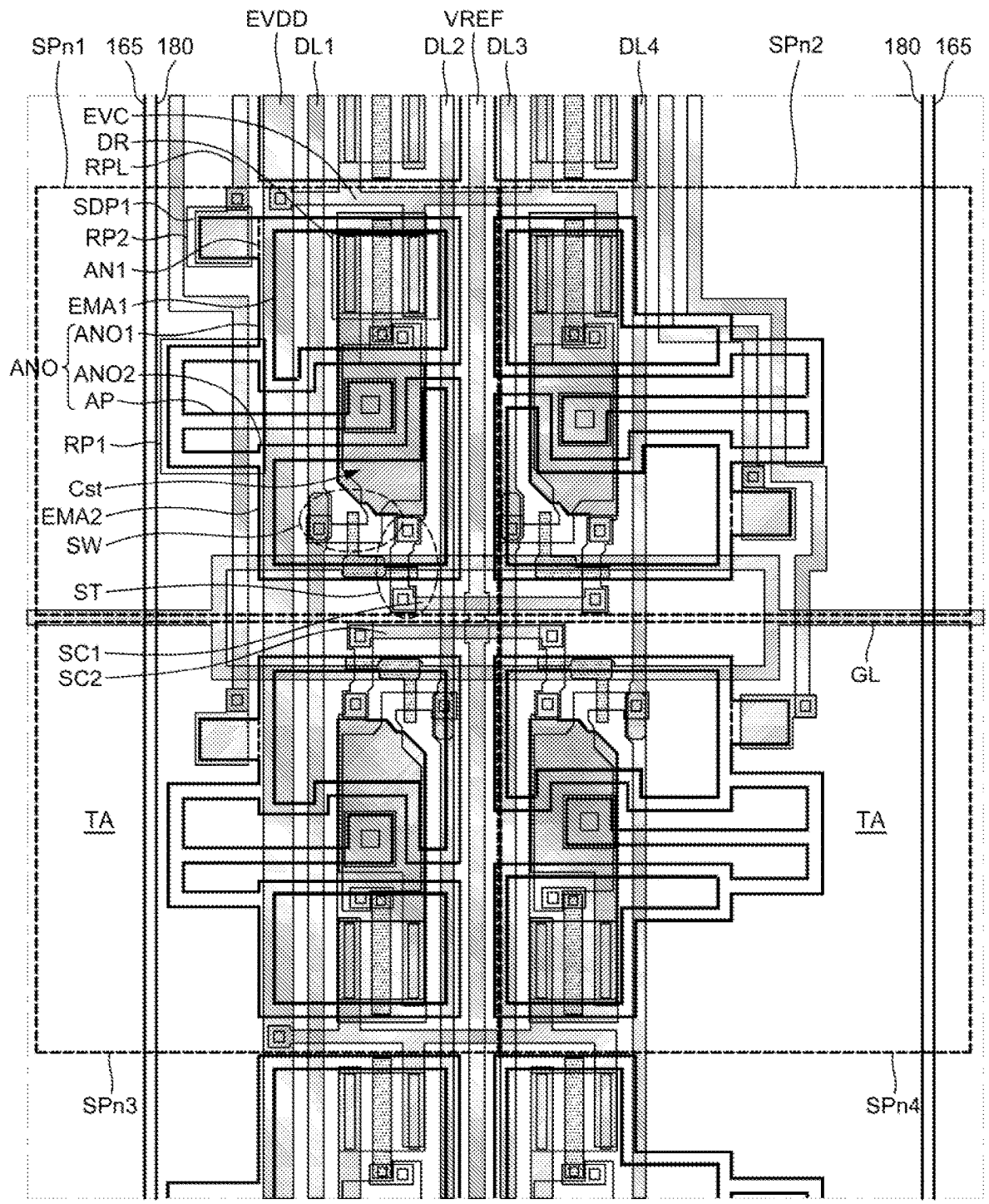
FIG. 15 is a plan view of the OLED display device according to the second aspect of the present disclosure.

FIG. 9 is a cross-sectional view of an OLED display device according to a second aspect of the present disclosure. FIG. 10 is a graph showing the refractive index of IGZO depending on the wavelength range and FIG. 11 is a graph showing the refractive index of ITO depending on the wavelength range. FIG. 12 is a graph showing the refractive index of IZO depending on the wavelength range. FIG. 13 and FIG. 14 are plan views illustrating a plane layout of a black matrix according to the second aspect of the present disclosure and FIG. 15 is a plan view of the OLED display device according to the second aspect of the present disclosure. In the following, parts identical or corresponding to those of the above-described first aspect will be briefly described.

Referring to FIG. 9, in the OLED display device according to the second aspect of the present disclosure, a light-shielding layer 420 is disposed on a first substrate 410, and a buffer layer 425 is disposed on the light-shielding layer 420. A semiconductor layer 430 of the driving transistor DR is disposed on the buffer layer 425, and a gate insulating layer 435 is disposed on the semiconductor layer 430. A gate electrode 440 is disposed on the gate insulating layer 435 corresponding to a certain region of the semiconductor layer 430, i.e., a channel. An interlayer insulating layer 445 is disposed on the gate electrode 440, and a source electrode 450a and a drain electrode 450b are disposed on the interlayer insulating layer 445. Therefore, the driving transistor DR is configured including the semiconductor layer 430, the gate electrode 440, the source electrode 450a and the drain electrode 450b.

A first protection layer 460 is disposed on the first substrate 410 including the driving transistor DR, and an overcoat layer 465 is disposed on the first protection layer 460. The overcoat layer 465 includes the via hole VIA through which the first protection layer 460 is exposed to expose the drain electrode 450b. The overcoat layer 465 is not disposed in the transmission area TA. Thus, it is possible to suppress a yellowish phenomenon of transmitted light caused by the overcoat layer 465. The organic light emitting diode OLED is disposed on the overcoat layer 465. More specifically, the first electrode ANO is disposed on the overcoat layer 465 and connected to the drain electrode 450b of the driving transistor DR through the via hole VIA. A bank layer 480 is disposed on the overcoat layer 465 on which the first electrode ANO has been formed. The bank layer 480 includes an opening 485 through which the first electrode ANO is exposed. Like the overcoat layer 465, the bank layer 480 is not disposed in the transmission area TA. Thus, it is possible to suppress a yellowish phenomenon of transmitted light caused by the bank layer 480.

The organic layer EML in contact with the first electrode ANO is disposed on the bank layer 480. The second electrode CAT is disposed on the organic layer EML. The organic layer EML and the second electrode CAT are formed entirely in the transmission area TA. Therefore, the organic light emitting diode OLED is configured including the first electrode ANO, the organic layer EML and the second electrode CAT.

Meanwhile, unlike the above-described first aspect, a conductive layer 500 is disposed on the second electrode CAT. The conductive layer 500 functions as an auxiliary electrode to reduce a resistance of the second electrode CAT and suppress a voltage drop of the second electrode CAT. Thus, it is possible to improve the display quality. Also, the conductive layer 500 may function as the capping layer described in the first aspect. That is, the conductive layer 500 may function as a protection layer to suppress the oxidation of the second electrode CAT caused by moisture and oxygen from the outside.

Further, the conductive layer 500 functions as a light compensation layer to reduce the loss of light emitted from the organic layer EML when the light passes through the second electrode CAT to the atmosphere and improve the luminous efficiency. The conductive layer 500 may be formed of materials that enable the refractive index of the conductive layer to be controlled by adjusting the composition ratio of elements of the conductive layer. For example, the conductive layer 500 may be formed of any one of IGZO, ITO or IZO which has become conductive. IGZO enables the refractive index of a thin film to be easily controlled by adjusting the composition ratio of indium (In), gallium (Ga), zinc (Zn) and oxygen (O). ITO also enables the refractive index of a thin film to be easily controlled by adjusting the composition ratio of indium (In), tin (Sn) and oxygen (O). Further, IZO enables the refractive index of a thin film to be easily controlled by adjusting the composition ratio of indium (In), zinc (Zn) and oxygen (O).

The refractive indexes of IGZO, ITO and IZO in each wavelength range are shown in FIG. 10 through FIG. 12, respectively. Referring to FIG. 10 through FIG. 12, the refractive index of IGZO is from 1.95 to 2.3 at a wavelength ranging from 250 nm to 800 nm. Also, the refractive index of ITO is from 1.83 to 2.35 and the refractive index of IZO is from 1.93 to 2.3 in the same wavelength range. The conductive layer 500 can be formed to function as a desired light compensation layer by adjusting the composition ratio of IGZO, ITO or IZO to control the refractive index of IGZO, ITO or IZO within the above range.

Light emitted from the organic layer EML is incident into the conductive layer 500 through the second electrode CAT. Here, when light is incident from a high refractive index medium to a low refractive index medium, total reflection of light occurs at an angle equal to or more than a threshold angle, which results in the loss of light. Therefore, in the present disclosure, the conductive layer 500 is formed to have a higher refractive index than the second electrode CAT by adjusting the elemental composition ratio of IGZO or ITO in the conductive layer 500. Thus, light is allowed to be incident from the second electrode CAT having a low refractive index into the conductive layer 500 having a high refractive index. Thus, it is possible to suppress total reflection and thus possible to reduce the loss of light.

Further, in consideration of wavelengths of R, G and B, the conductive layer 500 may be formed to have an optimum thickness to increase constructive interference at each of the wavelengths. That is, the conductive layer 500 may function as a light compensation layer by adjusting the thickness according to constructive interference conditions (2nd cos $\theta = \lambda/2$ (2m+1)) of light in each wavelength range. In the equation 2nd cos θ=λ/2 (2m+1), n is the refractive index of the conductive layer, d is the thickness of the conductive layer, θ is a refraction angle, and m is an integer except 0. Particularly, the conductive layer 500 is formed as a thin film having a high refractive index of 1.8 or more by adjusting the composition ratio of IGZO or ITO which has become conductive and thus may be further reduced in thickness. This is because as the refractive index of a thin film gets higher, the thin film may satisfy the constructive interference conditions even when the thickness of the thin film is reduced under the constructive interference conditions. Even if the thickness of the conductive layer 500 is reduced, the conductive layer formed by sputtering can be a denser thin film. Therefore, the conductive layer can block the permeation of moisture from the outside.

The conductive layer 500 may be formed of IGZO which has become conductive through plasma process. IGZO is an oxide and thus is not oxidized by oxygen and moisture from the outside. Therefore, the conductive layer 500 can protect the second electrode CAT. Also, IGZO has become conductive and thus has a low resistance. Therefore, the conductive layer 500 can function as an auxiliary electrode to reduce a resistance of the second electrode CAT. However, the conductive layer 500 of the present disclosure is not limited thereto and may be formed of any material as long as it is a transparent and low-resistance oxide.

Meanwhile, a second substrate 520 is disposed to face the first substrate 410. The second substrate 520 may be formed as a transparent substrate to transmit light. A black matrix 530 and a color filter 540 are disposed on a surface of the second substrate 520, i.e., a surface of the second substrate 520 facing the first substrate 410. The color filter 540 changes the color of light emitted from the organic layer EML. For example, the color filter 540 may change white light emitted from the organic layer EML into red, green or blue light.

The black matrix 530 is disposed around the color filter 540. The black matrix 530 functions to suppress color mixing between sub-pixels and improve the contrast. In the second aspect of the present disclosure, the black matrix 530 may be conductive so that it can function as an auxiliary electrode. For example, the black matrix 530 may be conductive and formed as a single layer or a multilayer of copper, molybdenum, titanium, chromium or an alloy thereof which has a low reflectance so as to function as a black matrix.

As shown in FIG. 13, the black matrix 530 may have a mesh shape in which color filters 540 of the respective sub-pixels R, G, B and W are placed. The black matrix 530 may separate the sub-pixels from the transmission areas. Also, as shown in FIG. 14, the black matrix 530 is formed into a mesh shape in the active area A/A and integrated into one body outside the active area A/A. The integrated black matrix 530 may be connected to a cathode power line (not shown) outside the active area A/A and supplied with cathode power.

Meanwhile, referring to FIG. 9 again, the first substrate 410 and the second substrate 520 are bonded to each other using a sealant 550 coated on the edges of the first substrate 410. Here, a fill material 560 is filled between the first substrate 410 and the second substrate 520. In the second aspect of the present disclosure, the fill material 560 is conductive to electrically connect the conductive layer 500 and the black matrix 530. That is, the fill material 560 may be formed of a conductive fill material that exhibits conductivity. The conductive fill material 560 may be formed of an organic material such as a conductive polymer.

Therefore, in the second aspect of the present disclosure, the conductive layer 500 in direct contact with the second electrode CAT is electrically connected to the conductive black matrix 530 using the conductive fill material 560. Thus, it is possible to reduce a resistance of the second electrode CAT by distributing the resistance to the conductive fill material 560 and the conductive black matrix 530.

Accordingly, in the second aspect of the present disclosure, the second electrode CAT is connected to the black matrix 530 that functions as a cathode power line. Thus, a cathode contact portion where a second electrode is in contact with a cathode power line in an active area can be omitted. Specifically, in the example shown in FIG. 4, the cathode contact portion CAC is provided between a sub-pixel and the transmission area TA, but in the second aspect shown in FIG. 15, a cathode contact portion can be omitted. Thus, the size of the transmission area may increase by as much as the size of the omitted cathode contact portion. Therefore, it is possible to improve the transparency of the OLED display device according to the second aspect of the present disclosure.

It will be understood by a person with ordinary skill in the art that various changes and modifications may be applicable within a range not departing from the technical idea of the present disclosure. Accordingly, the technical scope of the present disclosure is not limited to the detailed description of the specification, but should be defined by the accompanying claims.

What is claimed is:

1. An organic light emitting diode display device, comprising:
   a first substrate;
   an organic light emitting diode including a first electrode, an organic layer and a second electrode, and disposed on the first substrate;
   a conductive layer disposed on the second electrode so as to cover the second electrode;
   a second substrate disposed over the first substrate;
   a conductive black matrix disposed on a surface of the second substrate that faces the first substrate;
   a sealant bonding the first substrate and the second substrate;
   a conductive fill material filled between the first substrate and the second substrate;
   a color filter disposed between the conductive black matrix,
   wherein the conductive layer faces the color filter disposed between the conductive black matrix, and
   further comprising a transmission area corresponding to an area except for an area where the organic light emitting diode and the conductive black matrix are disposed,
   wherein the transmission area transmits light from a back surface of the first substrate.

2. The organic light emitting diode display device according to claim 1, wherein the second electrode is in direct contact with the conductive layer.

3. The organic light emitting diode display device according to claim 2, wherein the conductive layer is in direct contact with the conductive fill material.

4. The organic light emitting diode display device according to claim 3, wherein the conductive fill material is in direct contact with the conductive black matrix.

5. The organic light emitting diode display device according to claim 1, wherein the conductive layer includes one of IGZO, ITO, and IZO.

6. The organic light emitting diode display device according to claim 5, wherein the conductive layer has a higher refractive index than the second electrode.

7. The organic light emitting diode display device according to claim 1, wherein the conductive black matrix includes one of copper, molybdenum, titanium, chromium, or an alloy thereof.

8. The organic light emitting diode display device according to claim 1, wherein the color filter is disposed in the conductive black matrix, and
wherein the conductive black matrix has a mesh shape in which the plurality of color filters are placed.

9. The organic light emitting diode display device according to claim 1, wherein the organic layer, the second electrode and the conductive layer are superimposed in the transmission area.

10. The organic light emitting diode display device according to claim 1, further comprising a thin film transistor connected to the first electrode of the organic light emitting diode.

11. The organic light emitting diode display device according to claim 1, wherein the second electrode is connected to a cathode power line.

12. The organic light emitting diode display device according to claim 1, further comprising:
a first anode connection pattern formed as one body with the first electrode;
a connection pattern overlapping with a portion of the first anode connection pattern; and
a repair line connected to the connection pattern,
wherein the repair line is for electrically connecting the first electrode and another first electrode comprised in an adjacent sub-pixel to each other.

13. The organic light emitting diode display device according to claim 1, wherein the conductive fill material electrically connects the conductive layer and the conductive black matrix.

14. The organic light emitting diode display device according to claim 1, wherein the conductive black matrix is connected to a cathode power line.

* * * * *